(12) United States Patent
Yanni

(10) Patent No.: US 7,903,025 B2
(45) Date of Patent: Mar. 8, 2011

(54) MULTIPLE CLOCK SIGNAL GENERATION FROM A COMMON OSCILLATOR

(75) Inventor: Mamdouh Yanni, Kitchener (CA)

(73) Assignee: Research In Motion Limited, Waterloo, Ontario (CA)

(*) Notice: Subject to any disclaimer, the term of this patent is extended or adjusted under 35 U.S.C. 154(b) by 390 days.

(21) Appl. No.: 12/046,701

(22) Filed: Mar. 12, 2008

(65) Prior Publication Data

US 2009/0231188 A1    Sep. 17, 2009

(51) Int. Cl.
*G01S 19/23* (2010.01)
*G01S 19/36* (2010.01)

(52) U.S. Cl. .............................. 342/357.62; 342/357.76

(58) Field of Classification Search .............. 342/357.1, 342/357.12, 357.62, 357.76, 357.77
See application file for complete search history.

(56) References Cited

U.S. PATENT DOCUMENTS

| | | | | |
|---|---|---|---|---|
| 6,064,336 | A * | 5/2000 | Krasner | 342/357.05 |
| 7,155,183 | B2 * | 12/2006 | Abraham | 455/192.1 |
| 7,224,950 | B2 * | 5/2007 | McBurney | 455/258 |
| 7,551,131 | B2 * | 6/2009 | Jin | 342/357.62 |
| 7,693,482 | B2 * | 4/2010 | Eade | 455/12.1 |
| 2001/0028321 | A1 | 10/2001 | Krasner | |
| 2006/0049982 | A1 * | 3/2006 | Wells | 342/357.1 |
| 2007/0241956 | A1 * | 10/2007 | Jin | 342/357.1 |

* cited by examiner

*Primary Examiner* — Gregory C Issing
(74) *Attorney, Agent, or Firm* — Novak Druce + Quigg LLP

(57) ABSTRACT

A system and method of providing a clock signal to a navigation satellite receiver in a device is disclosed. A clock signal generated by a voltage controlled temperature compensated crystal oscillator (VCTCXO) in a cellular engine of the same device is appropriated to clock a numerically controlled oscillator (NCO) programmed to generate an adjusted clock signal suitable for use in receiving signals from navigation satellites and to heterodyne them down to baseband or an intermediate frequency for processing. Preferably, if the cellular engine has an automatic frequency control (AFC) module for adjusting the voltage control input to the VCTCXO to compensate for a change in the operating environment of the cellular engine, the AFC module modifies the control word in the NCO to counteract such adjustment so that the adjusted clock signal provided to the navigation satellite receiver is not unduly impacted. The use of the NCO ensures that the adjusted clock signal remains phase continuous throughout any such adjustments, so that positional lock of the navigation satellite receiver should not be lost. The sharing of the VCTCXO by the cellular engine and the navigation satellite receiver results in component cost and board space savings, economy in power consumption and reduced engineering effort in routing clock signals throughout the circuit board.

20 Claims, 5 Drawing Sheets

MULTIPLE CLOCK SIGNAL GENERATION FROM A COMMON OSCILLATOR

RELATED DOCUMENTS

Not Applicable.

FIELD

The present disclosure relates to clock oscillators and, more particularly, to a method and circuit for generating a plurality of clock signals from a common crystal source.

BACKGROUND

Many modern wireless handheld communications devices, whether cellular telephone handsets or personal digital assistants (PDAs) are equipped with ancillary features.

One such feature that is gaining popularity is a GPS receiver whereby the present location of the handset of the PDA may be established to within a precision of a few to a few hundred feet and by which a precise map of the immediate vicinity and/or directions from such present location to a desired destination may be provided.

Such GPS receiver circuits typically make use of a fixed, free running crystal oscillator (XO) or temperature compensated crystal oscillator (TCXO) to generate a local clock to control its operation and to permit synchronization with a plurality of geosynchronous satellites forming part of the Global Positioning System (GPS).

Typically, wireless handheld communications devices also employ a crystal oscillator to clock and control the cellular radio circuitry and to permit communications with a cellular base station.

Accordingly, as board space and component cost of such devices is generally at a premium, it is desirable to provide a novel and improved circuit and method for implementing a plurality of clock circuits from a common crystal oscillator.

It is further desirable to provide a multiple clock circuit that has a reduced component count and board footprint.

It is still further desirable to provide a multiple clock event from a common crystal oscillator that may be used in a navigation satellite receiver, which is relatively impervious to adjustments to a voltage control input of the oscillator.

BRIEF DESCRIPTION OF THE DRAWINGS

The embodiments of the present application will now be described by reference to the following figures, in which identical reference numerals in different figures indicate identical elements and in which.

DETAILED DESCRIPTION

Figure 1:
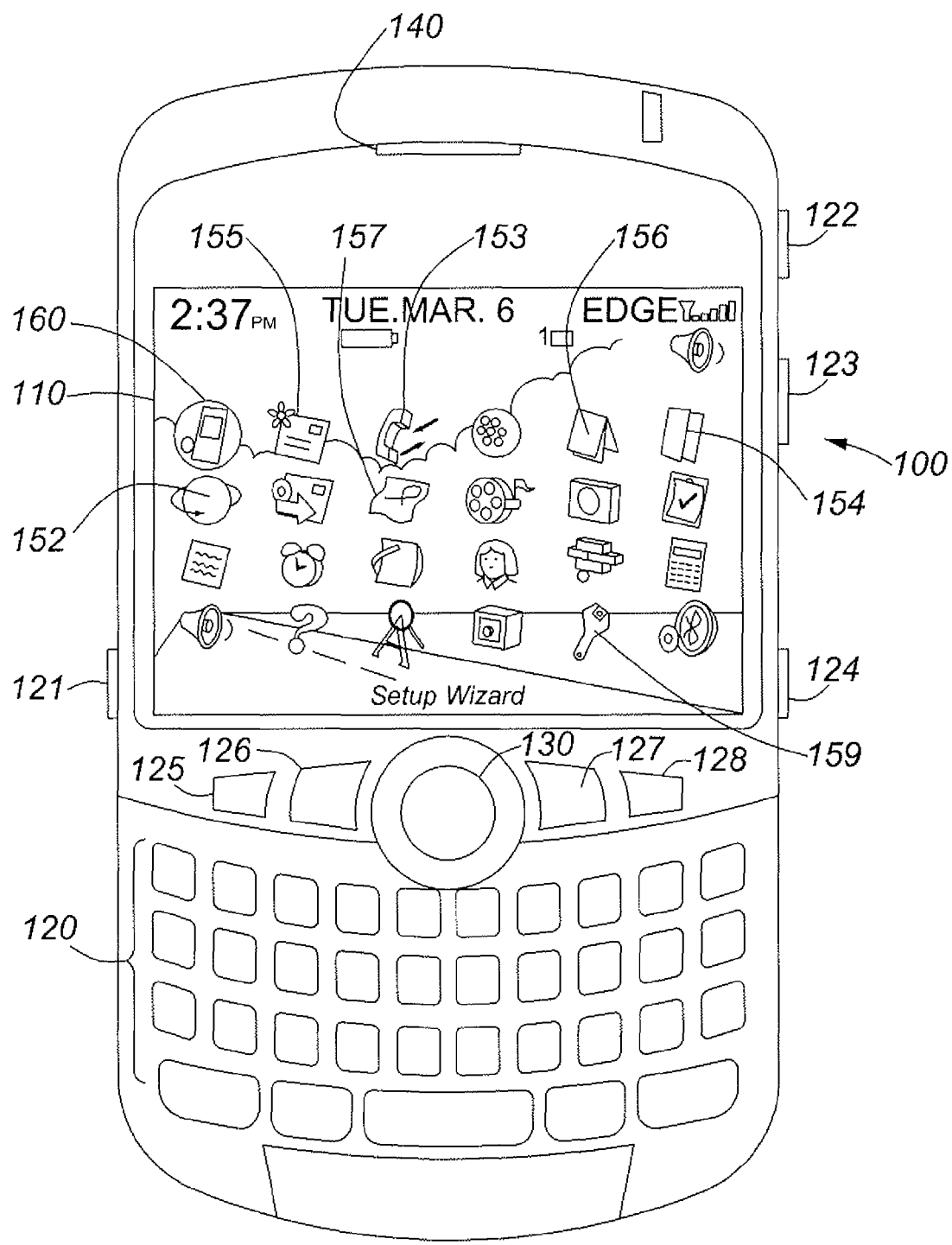
FIG. 1 is a graphical representation of a front view of an example of a mobile communications device to which example embodiments may be applied.

The present disclosure accomplishes the foregoing by providing an additional numerically controlled oscillator (NCO) in the GPS circuitry to clock the GPS circuitry from a voltage controlled temperature compensated crystal oscillator (VCTCXO) that is present in the handheld device to provide a clock signal for the cellular communications circuitry. The NCO may generate any of a number of multiple output frequencies from a single input frequency provided by the VCTCXO in a phase continuous fashion.

By monitoring frequency PPM (parts per million) clock error hits of the cellular communications circuitry, the value of a phase increment register of the NCO may be positively or negatively adjusted to compensate therefor and to ensure a relatively constant phase continuous output frequency for use by the GPS circuitry.

Conventional GPS circuits currently make use of a plurality of NCOs so that the addition of another, which amounts to a passive device comprising a few gates and an adder, will not add significantly to the cost of such devices or occupy a significant amount of board space, especially in comparison to the conventional free-running clock circuit with associated crystal that it effectively replaces. Furthermore, overall power consumption and start-up latency would be reduced and the task of routing clocking signals around the board to minimize interference would be considerably simplified.

Preferably, the additional NCO would be implemented within the GPS circuitry and adapted to be connected to and driven by the existing VCTCXO of the cellular circuitry of the wireless handheld device.

According to a first broad aspect of an embodiment of the present application there is disclosed a system for providing a clock signal to a navigation satellite receiver in a device comprising a heterodyning communications receiver, the system comprising: a voltage controlled oscillator for generating an output clock signal having a frequency suitable to heterodyne signals at the heterodyning communications receiver; and a numerically controlled oscillator (NCO) for generating, from the output clock signal, an adjusted output clock signal having a frequency suitable to heterodyne signals at the navigation satellite receiver, wherein a frequency of the output clock signal is governed by a voltage signal to the voltage controlled oscillator received from the heterodyning communications receiver, the frequency of the adjusted output clock signal being adjustable in a phase and frequency continuous manner so as to compensate for a change in an operating environment of the heterodyning communications receiver.

According to a second broad aspect of an embodiment of the present application, there is disclosed a method for providing a clock signal to a navigation satellite receiver in a device comprising a heterodyning communications receiver and a voltage controlled oscillator, the method comprising: the voltage controlled oscillator generating an output clock signal having a frequency suitable to heterodyne signals at the heterodyning communications receiver; and based on a voltage signal received from the heterodyning communications receiver; and a numerically controlled oscillator (NCO) generating, from the output clock signal, an adjusted output clock signal in a phase and frequency continuous manner having a frequency suitable to heterodyne signals at the navigation satellite receiver, so as to compensate for a change in an operating environment of the heterodyning communications receiver.

According to a third broad aspect of an embodiment of the present application, there is disclosed a numerically controlled oscillator (NCO) coupled to a navigation satellite receiver in a device comprising a heterodyning communications receiver and a voltage controlled oscillator for generating an output clock signal having a frequency suitable to heterodyne signals at the heterodyning communications receiver, the NCO for generating, from the output clock signal, an adjusted output clock signal having a frequency suitable to heterodyne signals at the navigation satellite receiver, wherein a frequency of the output clock signal is governed by a voltage signal to the voltage controlled oscillator received from the heterodyning communications receiver, the frequency of the adjusted output clock signal being adjustable in a phase and frequency continuous manner so as to compensate for a change in an operating environment of the heterodyning communications receiver.

The present disclosure will now be described for the purposes of illustration only, in conjunction with certain embodiments shown in the enclosed drawings.

The Communications Device

Referring now to the drawings, FIG. 1 is a graphical representation of a front view of an example of an electronic communications device 100 to which example embodiments described herein can be applied. The communications device 100 is a two-way mobile communications device having electronic messaging communications capabilities and possibly also voice communications capabilities. Depending on the functionality provided by the communications device 100, in various embodiments the communications device 100 may be a data communications device, a multiple-mode communications device configured for both data and voice communication, a mobile telephone, a PDA enabled for wireless communications, a computer system with a wireless modem or wireless network card, or a computer or phone device with a fixed connection to a network, among other things. The communications device 100 is, in at least one example embodiment, a handheld device having a casing or housing that is dimensioned to fit into a purse, pocket or belt-mounted device holster.

The communications device 100 includes a display screen 110, an alphanumeric keyboard or keypad 120, optionally one or more non-keyboard inputs, such as buttons 121-128 and/or a rotatable input device such as a trackball 130 or scrollwheel (not shown) and a speaker 140. In some example embodiments keys in the keyboard 120 may contain one or more letters aligned in a QWERTY layout. In some embodiments the keys in the keyboard 120 may not be actual physical keys but may be virtual keys displayed on a touch screen display. In some example embodiments, the keyboard 120 includes a QWERTZ layout, an AZERTY layout, a Dvorak layout, or the like. In some example embodiments, the keyboard 120 layout has reduced keys, such as a reduced QWERTY layout.

Figure 2:
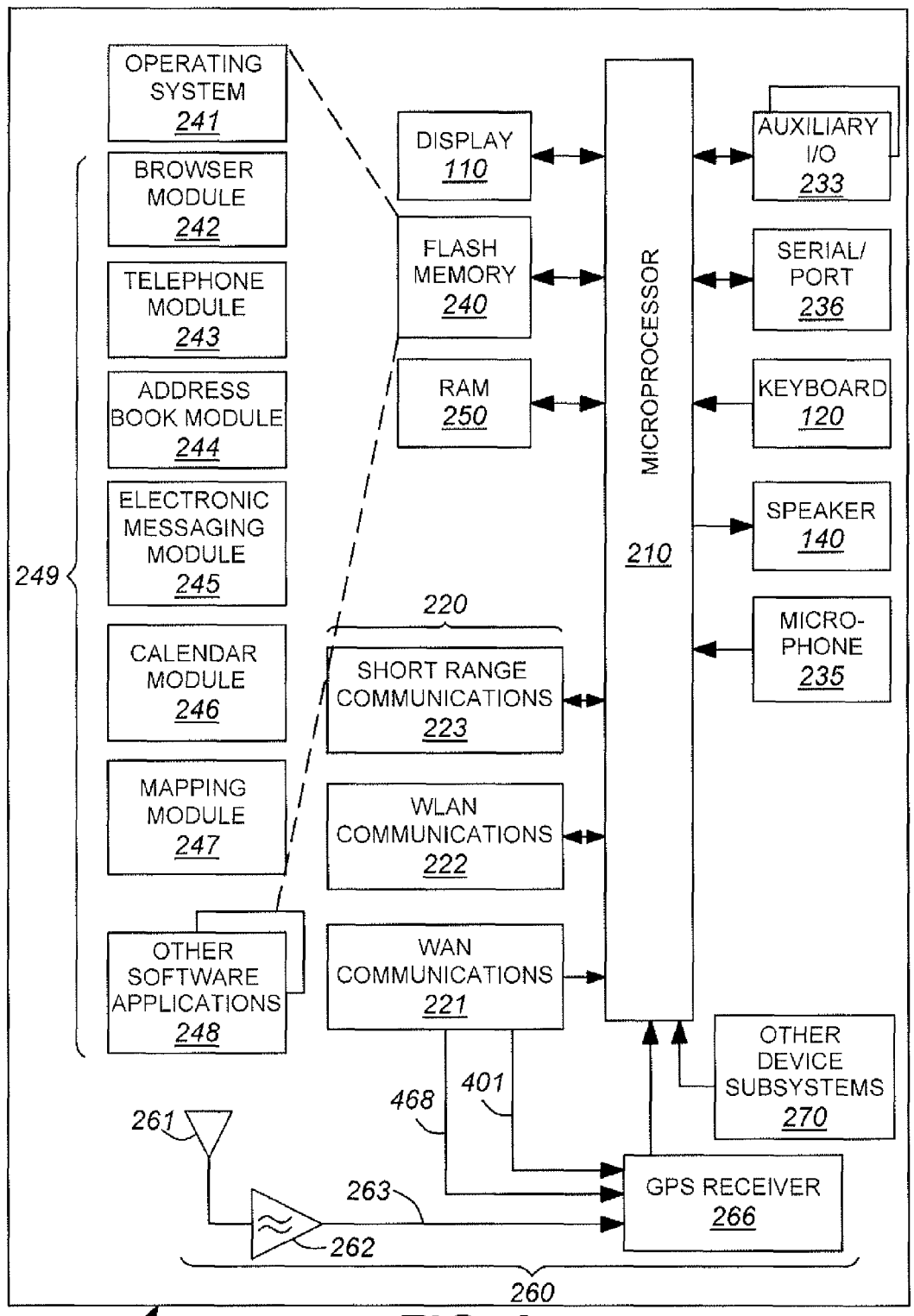
FIG. 2 is a simplified block diagram of the example device of FIG. 1.

Referring now to FIG. 2, the communications device 100 includes a controller that includes at least one microprocessor 210 for controlling the overall operation of the device 100. The microprocessor 210 interacts with a communications subsystem shown generally at 220 and with further device subsystems such as display 110, keyboard or keypad 120, one or more auxiliary input/output (I/O) subsystems or devices 233 (e.g. trackball 130, non-keyboard inputs 121-128 or a scrollwheel (not shown)), a speaker 140, a microphone 235, a serial port 236, a flash memory 240, random access memory (RAM) 250, a global positioning system (GPS) receiver subsystem 260, and any other device subsystems generally designated as 270.

The microprocessor 210 operates under stored program control of the operating system software and/or firmware 241 and various software and/or firmware applications 249 used by the microprocessor 210, which are, in one example embodiment, stored in a persistent store such as flash memory 240 or similar storage element. Those skilled in the art will appreciate that the operating system 241, software applications shown generally at 249, or parts thereof, may be temporarily loaded into a volatile store such as RAM 250.

The microprocessor 210, in addition to its operating system functions, in example embodiments, enables execution of software applications 249 for interacting with the various device subsystems of the device 100. A predetermined set of software applications 249, which control basic device operations, including data and voice communication applications, such as a browser module 242, a telephone module 243, an address book module 244, an electronic messaging module 245 (which may include e-mail, SMS messaging and/or PIN messaging) and a calendar module 246, for example, will normally be installed on the communications device 100 during manufacture. Further software applications 249, such as a GPS/mapping module 247, may also be loaded onto the communications device 100 during manufacture, or through the communications subsystem 220, the auxiliary I/O subsystem 233, serial port 236, or any other suitable subsystem 270, and installed in the RAM 250 or a non-volatile store such as the flash memory 240 for execution by the microprocessor 210. Such flexibility in application installation increases the functionality of the device 100 and may provide enhanced on-device functions, communication-related functions, or both. In some embodiments, some or part of the functionality of the functional modules can be implemented through firmware or hardware components instead of, or in combination with, computer software instructions executed by the microprocessor 210 (or other processors).

Under instructions from various software applications 249 resident on the communications device 100, the microprocessor 210 is configured to implement various functional components or modules, for interacting with the various devices subsystems of the device 100.

The web browser module 242 permits access to a specified web address, for example via data transfer over one or more of the communications subsystem 220 components.

The telephone module 243 enables the communications device 100 to transmit and receive voice and/or data over one or more of the communications subsystem 220 components.

The address book module 244 enables address book information, such as telephone numbers, email and/or instant text messaging addresses and/or PIN numbers to be stored and accessed on the communications device 100.

The electronic messaging module 245 enables the communications device 100 to send and receive electronic messages over one or more of the communications subsystems 220 components. Examples of electronic messaging include email, personal identification number (PIN) messaging and/or short message service (SMS) messaging.

The calendar module 246 enables appointment and/or task information to be stored and accessed on the communications device 100.

The GPS/mapping module 247 enables storage, access and/or retrieval of detailed mapping information on the communications device 100 and may provide turn-by-turn directions from an initial map position to a desired destination map position in accordance therewith.

Referring briefly to FIG. 1 again there is shown an example of handheld communications device 100 on which a plurality of user selectable icons are shown on its display screen 110. The icons are each associated with functions that can be performed by the communications device 100. For example, FIG. 1 shows a browser icon 152 for accessing web browsing functions (associated with browser module 242), a phone icon 153 for accessing phone functionality (associated with telephone module 243), an address book icon 154 for accessing address book functions (associated with address book module 242), a messages icon 155 for accessing electronic messaging functions of the communications device 100 (associated with electronic messaging module 245), a calendar icon 156 for accessing calendar functions (associated with calendar module 246), a maps icon 157 for accessing GPS/mapping functions (associated with GPS/mapping module 247), and an options icon 159 (associated with an options module, which may be a separate module or executed by one or more existing modules). An icon is shown highlighted or focused by a caret or selection symbol 160 which can be navigated by a device user among the displayed icons through manipulation of the trackball 130 (or other navigational input device). The trackball 130 is also depressible, such that depression of the trackball 130 when an icon is highlighted or focused by selection symbol 160 results in the launch of functions of the associated module.

In FIG. 2, each of the software applications 249 may include layout information defining the placement of particular fields, such as text fields, input fields, etc., in a user interface for the software application 249.

Figure 3:
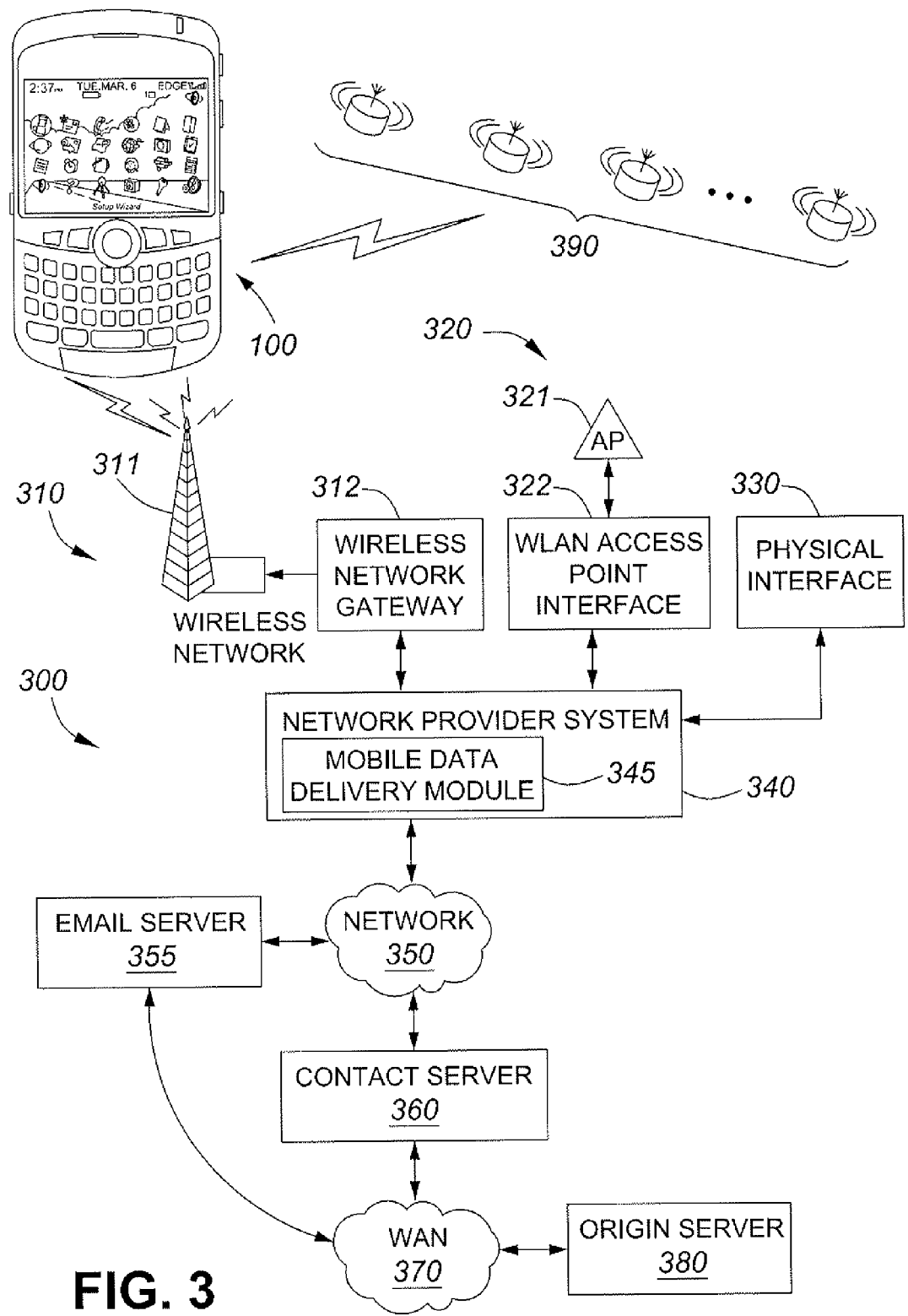
FIG. 3 is a simplified block diagram of a communications environment suitable for the example device of FIG. 1.

The communications subsystem 220 acts as an interface between the communications device 100 and a communications environment 300 shown in FIG. 3. As will be apparent to those skilled in the field of communications, the particular configuration of the communications subsystem 220 will be dependent upon the communications network(s) in the communications environment 300 in which the communications device 100 is intended to operate.

In FIG. 3, the communications environment 300 is shown to include one or more mobile electronic devices 100 (only one of which is shown in FIG. 3), a wireless Wide Area Network (WAN) 310 and associated base station 311, a Wireless Local Area Network (WLAN) 320, and/or other interfaces. In some example embodiments, the communications device 100 is configured to communicate in both data and voice modes over both WAN and WLAN networks and to roam between such networks.

Thus, in the example embodiment shown in FIG. 2, the communications subsystem 220 includes a WAN communications module 221, a WLAN communications module 222 and a short range communications module 223.

The WAN communications module 221 is for two-way communications with the WAN 310 and the WLAN communications module 222 is for two-way communications with the WLAN 320 along an access point 321 associated therewith. Both the WAN communications module 221 and the WLAN communications module 222 operate at radio frequency (RF). For example, if the WAN communications module 221 complies with the Global System for Mobile Communications (GSM) wireless standard, it operates at one or more of 850 MHz, 900 MHz, 1800 MHz or 1900 MHz.

Accordingly, typically, they each comprise front ends having RF antennas, amplifiers, RF transceivers and some signal processing capabilities, implemented, for example, by a digital signal processor.

Figure 4:
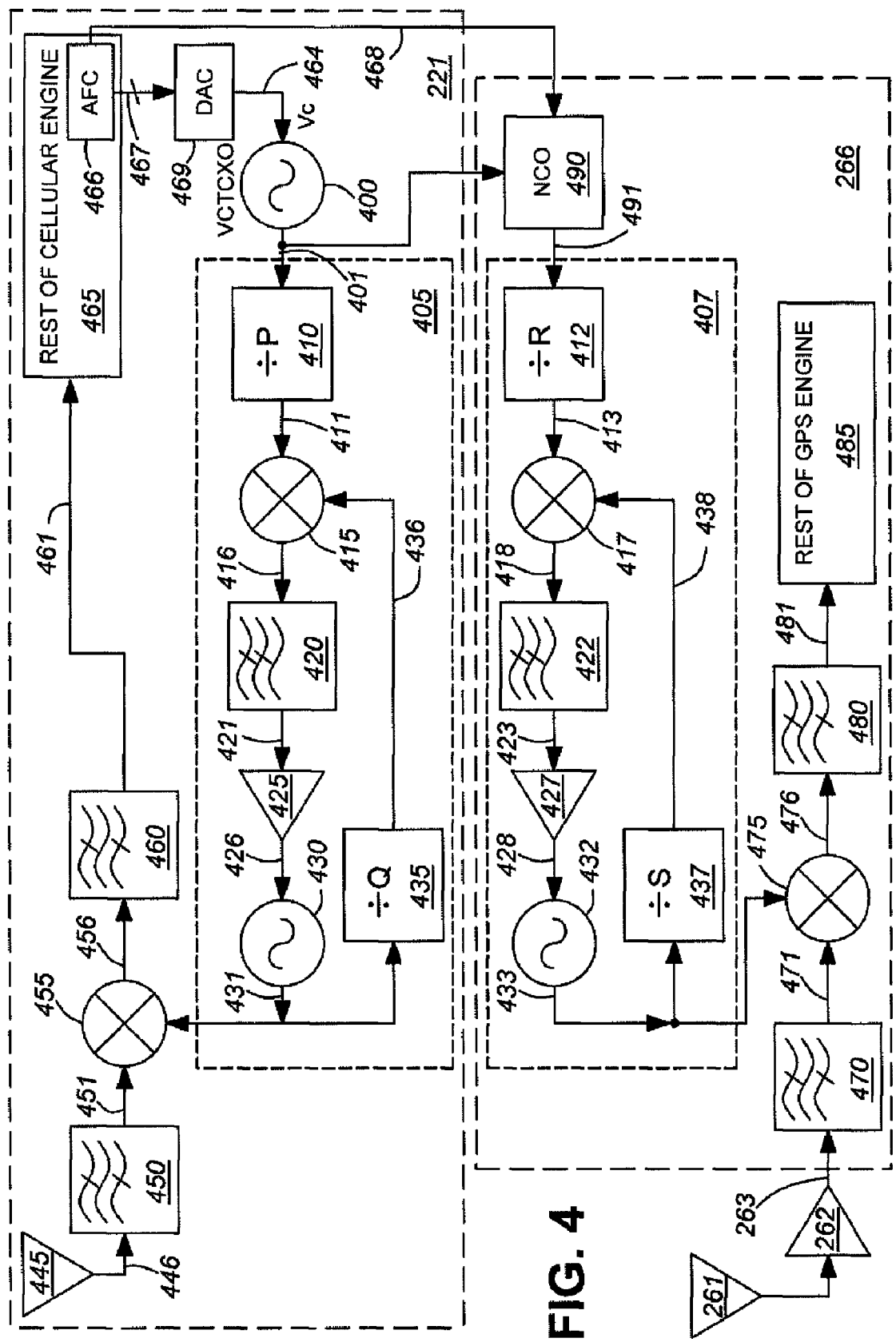
FIG. 4 is a simplified example block diagram of the WAN communications subsystem and the GPS receiver subsystem for the example device of FIG. 1.

Salient portions of an example embodiment of the front end of a receive path of the WAN communications module 221 (shown in dashed outline) are shown in FIG. 4, including a voltage controlled TCXO (VCTCXO) 400, a phase locked loop (PLL) or synthesizer or frequency multiplier circuit 405 (shown in dashed outline), an RF antenna 445, a first bandpass filter 450, a WAN RF mixer 455 and a second bandpass filter 465. The remainder of the cellular engine of the WAN communications module 221 is shown as block 465 and comprises an automatic frequency control module 466.

The VCTCXO 400 typically comprises a crystal oscillator circuit connected to a crystal (not shown). The crystal generates piezoelectric impulses that are forwarded to the crystal oscillator circuit. The oscillator circuit makes use of high-Q resonance of the piezoelectric effect from the crystal and generates a periodic signal that is typically free-running around a specific nominal frequency, which may be, in an example GSM embodiment, 26 MHz, that it forwards to the PLL 405 along signal line 401. Due to factors such as temperature, voltage, loading, aging and manufacturing variations, the actual frequency is not typically exactly equal to the nominal frequency. Thus, compensation components (not shown) are added to enhance the temperature stability of the basic oscillator to improve performance.

The crystal is typically one of the more expensive components of the cellular engine, costing on the order of $1.50-$2.00 each.

The PLL 405 may itself comprise, in an example embodiment, a divide by P block 410, a phase detector 415, a low pass filter 420, an amplifier 425, a voltage controlled oscillator 430 and a divide by Q block 435.

The divide by P block 410 divides the nominal frequency of the input oscillator signal generated by the VCTCXO 400 and received along signal line 401 down by an integer value P and forwards it to the phase detector 415 along signal line 411.

The phase detector 415 generates a difference signal between the divided down oscillator reference signal along signal line 411 and a feedback signal 436 generated by the divide by Q block 435. The difference signal is forwarded to the low pass filter 420 along signal line 416.

The low pass filter 420 acts as a loop filter and removes any high frequency noise artifacts from the difference signal arriving along signal line 416 and forwards it to the amplifier 425 along signal line 421.

The amplifier 425 amplifies the filtered difference signal arriving along signal line 421 and forwards it to the VCO 430 as a voltage control signal along signal line 426. The amount of amplification is chosen to derive an appropriate output frequency for the VCO 430.

The VCO 430 generates a clock signal that it forwards along signal line 431 to the WAN mixer 455 and the divide by Q block 435 in response to the input therein of the suitably amplified and filtered difference signal arriving along signal line 426. Advantageously, the clock signal frequency may be appropriate to heterodyne WAN signals down to baseband or IF for processing by the rest of the cellular engine 465.

The divide by Q block 435 provides a feedback path for the clock signal arriving along signal line 431. It divides the frequency of the signal by an integer value Q, which generally corresponds to the amount of frequency multiplication effected by the amplification of the voltage control signal 426 from the amplifier 425 before being input to the VCO 430, and forwards it to a second input of the phase detector 415 along signal line 436.

The remainder of the front end circuitry of the receiver portion of the WAN communications module 221 is largely conventional. The RF antenna 445 receives and transmits RF signals and forwards the received signals along signal line 446 to the first bandpass filter 450.

The first bandpass filter 450 filters out of band signals from the received signal arriving along signal line 446 and forwards them to the WAN mixer 455 along signal line 451.

The WAN mixer 455 heterodynes the filtered received signal arriving along signal line 451 with the clock signal arriving along signal line 431. The clock signal has a frequency chosen to bring the data content of the filtered received signal down to baseband or to an intermediate frequency. The baseband or IF signal is forwarded to the second bandpass filter 460 along signal line 456.

The second bandpass filter 460 further filters the baseband or IF signal (to eradicate any undesirable sidelobes arising from the heterodyning operation) and forwards the resulting signal to the rest of the cellular engine (denoted 465) of WAN communications module 221 along signal line 461 for processing in conventional fashion.

The rest of the cellular engine 465 is also largely conventional. In the present application, it contains an automatic frequency control (AFC) module 466. The AFC module 466 acts as a frequency lock loop system that is clocked at twice the speed of the basic cellular clock tick. In an example GSM embodiment, the basic tick will be 4.6 ms. The AFC module 466 keeps track of the reference base station frequency timing and implements any appropriate frequency corrections through adjusting the voltage control signal output by the DAC 469 that drives the VCTCXO 400.

Each time a transmission takes place, a frequency error between the VCTCXO 400 and the reference frequency of the base station is estimated by the AFC module 466, along with a quality factor. The frequency error is integrated and compared against a threshold dead zone, which may be, in a GSM environment, ±25 Hz. If the integrated frequency error exceeds the threshold dead zone, a correction is applied to the VCTCXO. Typically, corrections will be made between a minimum (say 10) and a maximum (say 1000) number of frequency error samples.

The number of frequency error samples per frame depends upon the communications scheme and the type of frame. For example, in the GSM system, which contains 8 time slots, a phone call frame will only generate a single frequency error measurement together with its quality metric per frame transmission. On the other hand, in a packet data mode, up to 4 frequency error measurements together with their corresponding quality metrics will be conducted per frame transmission.

Theoretically, once signal lock has been achieved, the frequency and phase of the two signals should closely approximate one another.

With good weather, short sightlines and a stationary device 100, it is likely that any frequency and/or phase differences between the signal will be minimal. However, when such optimal conditions are not all present, especially when the device 100 is moving quickly, the frequency and phase correspondence between the signals may degrade significantly and rapidly. The problem may be particularly acute when the device 100 is handed over from one base station 311 to another. While the base stations are supposed to be synchronized in frequency, it has been observed in GSM base stations that a frequency disparity of as much to 100 Hz may be present between adjacent base stations 311. In such circumstances, for example, when the degradation exceeds a predetermined threshold, the AFC module 466 may provide a digital word as a "kick" along signal line 467 to a digital to analog converter (DAC) 469 that is converted into a voltage signal 464. The voltage signal 464 is fed to the voltage control input of the VCTCXO 400.

The AFC module 466 also generates a digital word along signal line 468 as a counter-"kick" to a numerically controlled oscillator (NCO) 490 that replaces a clock oscillator circuit for clocking the GPS receiver 266.

Typically, the AFC module 466 will operate a plurality of AFC frequency lock loops. In addition to the loop described above to maintain frequency synchronization between the device 100 and the currently associated base station 311, there may be an additional loop to maintain frequency synchronization between the device 100 and a neighbouring base station (not shown) against the possibility of a handover of the device 100 between base stations. In this manner, an appropriate "kick" may be applied at time of handover to compensate for frequency handover error. Anecdotal tests in a local market suggest that the frequency handover error between a pair of GSM base stations is less than about 4 kHz, which can be handled by the described implementation.

Referring back to FIG. 2, the short-range communications subsystem 223 may provide for communication between the communications device 100 and different systems or devices, which need not necessarily be similar devices. For example, the short-range communications module 223 may include an infrared device and associated circuits and components and/or a Bluetooth™ communications module to provide for communication with similarly enabled systems and devices.

In a data communications mode, a received signal such as a text message or web page download will be processed by the communications subsystem 220 and output to the microprocessor 210, which further processes the received signal for output to the display 231, or alternatively to an auxiliary I/O device 233.

The keyboard 120 and other various input devices, including, an auxiliary I/O device 223 (such as the buttons 121-128 and the trackball 130) and/or the microphone 235 on the communications device 100 may also be used to compose data items within the software applications 249, such as email messages or voice communications, in conjunction with the display 110, possibly an auxiliary I/O device and/or the speaker 140. Such composed items and/or voice communications may then be transmitted and received over a communications network in the communications environment 300 through the communications subsystem 220.

The serial port 236 comprises a USB-type interface port for interfacing or synchronizing with another device, such as a desktop computer (not shown). The serial port 236 is used to set preferences through an external device or software application. The serial port 236 may also be used to extend the capabilities of the communications device 100 by providing for information or software downloads, including user interface information, to the communications device 100.

The flash memory 240 or other persistent storage of the communications device 100 may house, in addition to software and/or firmware stored program instructions, certain information including address book information such as telephone numbers, email and/or instant text messaging addresses and PIN numbers. Such information may also be at least partially stored at least some of the time in memory of a Subscriber Identity Module (SIM) card (not shown) used with the communications device 100, in volatile device memory (such as the RAM 250), and/or at a location accessible to the communications device 100 over the WAN 310.

Additionally, the flash memory 240 may be used to store data structures, preferences and/or parameters.

The RAM 250, which may constitute non-volatile or volatile memory, with or without battery backup, may be used as a supplement to, or in place of, flash memory 240, and to maintain data and/or program instructions for use by the microprocessor 210 in executing one or more of the functions of operating system 241 and/or the software applications 249, including but not limited to the GPS/mapping module 247.

The GPS receiver subsystem 260 may comprise an antenna 261, an amplifier 262 and a GPS receiver 266. Those having ordinary skill in this art will readily appreciate that while the American Global Positioning System (GPS) is referenced throughout, methods and apparatus described in this application may equally be used in conjunction with other types of global or regional navigation satellite systems, including but not limited to the European Galileo, Russian GLONASS, and Chinese Beidou Compass systems.

The antenna 261 is a passive receive-only antenna and is connected to the amplifier 262.

The amplifier 262, which may be a low noise amplifier (LNA), is connected to the antenna 261 and to the GPS receiver 266. It amplifies high-frequency low power signals received from the GPS satellites 390 as discussed below, amplifies them and forwards them to the GPS receiver 266 along signal line 263.

The GPS receiver 266 is a modified GPS or A-GPS receiver navigation platform, such as the GSC3 LTi GPS chip manufactured by SiRF Technology, Inc.

Salient portions of an example embodiment of the front end of the GPS receiver 266 are also shown in FIG. 4, including NCO 490, a phase locked loop 407, a first bandpass filter 470, a GPS mixer 475 and a second bandpass filter 480. The remainder of the GPS receiver 266 is shown as block 485.

The NCO 490 accepts as input the free-running periodic signal along signal line 401 from the VCTCXO 400, as well as a counter-"kick" digital word along signal line 468 from the AFC module 465.

Figure 5:
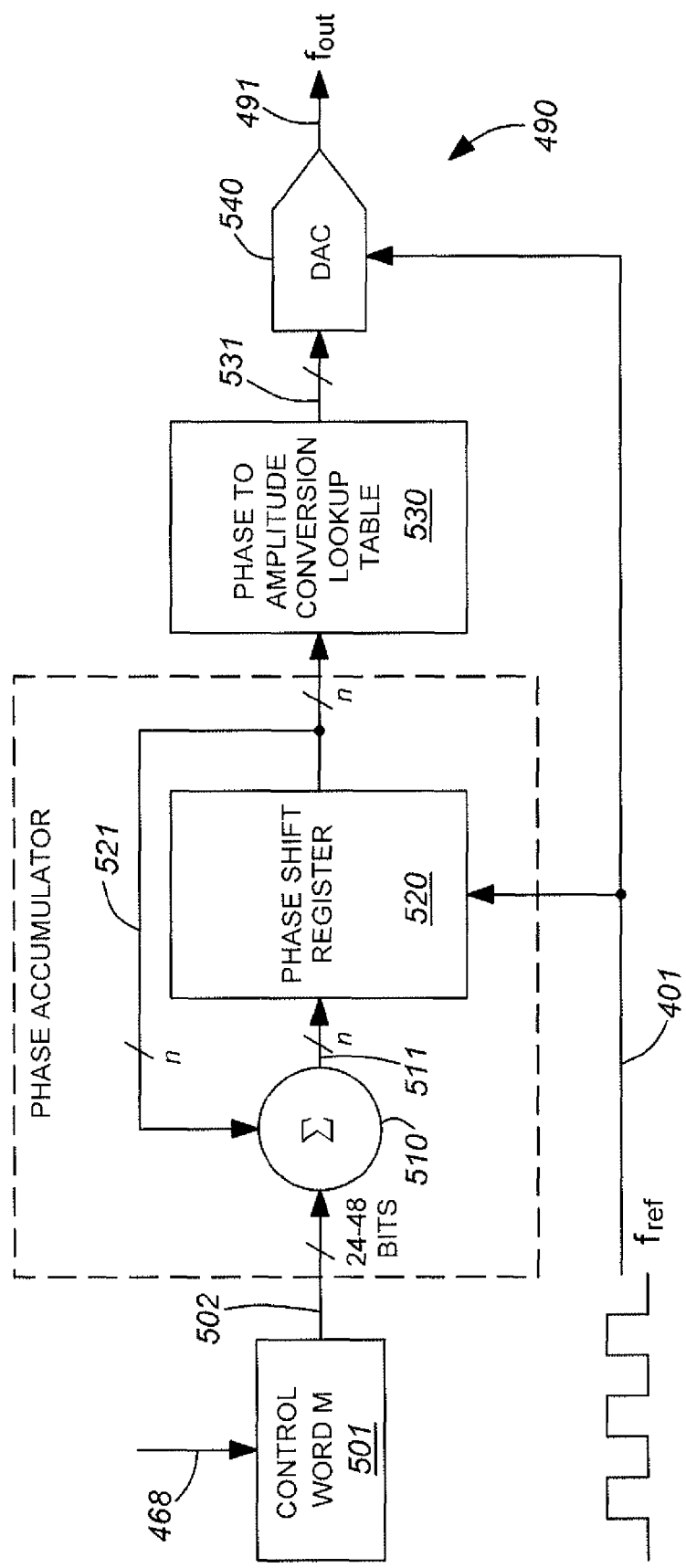
FIG. 5 is a simplified block diagram of a numerically controlled oscillator suitable for use in the example block diagram of FIG. 4.

An NCO 490 is a passive device that is able to generate a frequency and phase-tunable output signal from a fixed-frequency precision clock source. As shown in the representative simplified block diagram of an NCO 490 in FIG. 5, the NCO 490 comprises an adder 510, a shift register 520, a lookup table 530 and a DAC 540.

The adder 510 accepts two signal lines as inputs. The first signal line 502 is a data bus of typically between 24 and 48 bits emanating from a control or tuning word register 501. The second signal line 521 is a data bus of length n of typically between 14 and 16 bits emanating from an output of the shift register 520. The adder 510 successively increments the output of the shift register 520 with the value of the control word (M) 501.

The control word M 501 may be selectively amended by the AFC module 466 by submission of a different value along signal line 468.

The shift register 520 accepts as input an n-bit data bus 511 from the output of the adder 510 and shifts it out to its output signal line 521, which is a data bus of length n, in response to an input clock signal of frequency $f_{ref}$ 401. Collectively, the adder 510 and the shift register 520 act as a phase accumulator that increments the stored number each time it receives a clock pulse. The stored number represents a phase of an output clock signal. Thus, the value of the control word M 501 will determine the phase step size of the output clock signal, with a higher frequency being associated with a larger control word value. Thus, the control word M defines the frequency tuning resolution of the NCO 490.

The lookup table 530 acts as a phase to amplitude converter and outputs a digital word along data bus signal line 531 representative of the amplitude of the output clock signal associated with a given phase value as represented by the output signal 521.

The DAC 540 converts the digital word input to it along data bus signal line 531 into an analog voltage level that constitutes the output clock signal that it outputs along clock signal 491.

The relationship between the output frequency $f_{out}$ and the reference clock frequency $f_{ref}$ is set out as follows:

$$f_{out} = \frac{M}{2n} * f_{ref} \quad (1)$$

where M is the value of the tuning word 501;
$f_{ref}$ is the frequency of the input clock signal 522; and
n is the number of bits in data bus 521.

The value of the control word M 501 may be adjusted at any time to vary the frequency of the output oscillator signal 491. The design of the NCO 490 ensures that such frequency changes are phase continuous.

Referring back to FIG. 4, the NCO 490 alters the frequency output by the VCTCXO 400, which is suitable to clock the WAN communications subsystem 221, along signal line 401 to a frequency suitable to clock the GPS receiver 266 and outputs it along signal line 491.

The PLL 407 may itself comprise, in an example embodiment, a divide by R block 412, a phase detector 417, a low pass filter 422, an amplifier 427, a voltage controlled oscillator (VCO) 432 and a divide by S block 437.

The divide by R block 412 divides the nominal frequency of the input oscillator signal generated by the NCO 490 and received along signal line 491 down by an integer value R and forwards it to the phase detector 417 along signal line 413.

The phase detector 417 generates a difference signal between the divided down oscillator reference signal along signal line 413 and a feedback signal 438 generated by the divide by S block 437. The difference signal is forwarded to the low pass filter 422 along signal line 418.

The low pass filter 422 acts as a loop filter and removes any high frequency noise artifacts from the difference signal arriving along signal line 418 and forwards it to the amplifier 427 along signal line 423.

The amplifier 427 amplifies the filtered difference signal arriving along signal line 423 and forwards it to the VCO 432 as a voltage control signal along signal line 428. The amount of amplification is chosen to derive an appropriate output frequency for the VCO 432.

The VCO 432 generates a clock signal that it forwards along signal line 433 to the GPS mixer 475 and the divide by S block 437 in response to the input therein of the suitably amplified and filtered difference signal arriving along signal line 426. Advantageously, the clock signal frequency may be appropriate to heterodyne GPS signals down to baseband or IF for processing by the rest of the GPS engine 485.

The divide by S block 437 provides a feedback path for the clock signal arriving along signal line 433. It divides the frequency of the signal by an integer value S, which generally corresponds to the amount of frequency multiplication effected by the amplification of the voltage control signal 428 by the amplifier 427 before being input to the VCO 432, and forwards it to a second input of the phase detector 417 along signal line 438.

The remainder of the front end circuitry of the receiver portion of the GPS receiver 266 is largely conventional. The GPS antenna 261 receives RF signals which may be optionally amplified by amplifier 262 and forwards the received signals to the first bandpass filter 450 along signal line 263.

The first bandpass filter 470 filters out of band signals from the GPS signals arriving along signal line 263 and forwards them to the GPS mixer 475 along signal line 471.

The GPS mixer 475 heterodynes the filtered received signal arriving along signal line 471 with the clock signal arriving along signal line 433. The clock signal has a frequency chosen to bring the data content of the filtered received GPS signal down to baseband or to an intermediate frequency. The baseband or IF signal is forwarded to the second bandpass filter 480 along signal line 476.

The second bandpass filter 480 further filters the baseband or IF signal (to eradicate undesirable sidelobes arising from the heterodyning operation) and forwards the resulting signal to the rest of the GPS engine 485 of GPS receiver 266 along signal line 481 for processing in conventional fashion.

The rest of the GPS engine 485 is entirely conventional. Typically, it contains circuitry to determine an appropriate frequency offset to be applied to the GPS clock signal 476, by which satellite message transmissions from the navigation satellites 390 may be received and a location of the GPS receiver 266 may be accurately determined.

The Communications Environment

Turning now to FIG. 3, the WAN 310 may be implemented as a packet-based cellular network that includes a number of base stations 311 (only one of which is shown), where each of the base stations 311 provides wireless Radio Frequency (RF) coverage to a corresponding area or cell. The wireless WAN 310 is typically operated by a cellular network service provider that sells subscription packages to users of mobile electronic devices. The WAN 310 comprises a number of different types of networks, for example, Mobitex Radio Network, DataTAC, GSM, GPRS (General Packet Radio System), TDMA (Time Division Multiple Access), CDMA (Code Division Multiple Access), CDPD (Cellular Digital Packet Data), IDEN (Integrated Digital Enhanced Network) or various other third generation networks such as EDGE (Enhanced Data rates for GSM Evolution) or UMTS (Universal Mobile Telecommunications Systems).

The communications environment 300 also includes a wireless network gateway 312 and one or more network provider systems 340. The wireless network gateway 312 provides translation and routing services between the network provider system(s) 340 and the WAN 310, which facilitates communication between the mobile electronic devices 100 and other devices (not shown) connected, directly or indirectly, to the network provider system 340.

The WLAN 320 comprises a network which, in some example embodiments conforms to IEEE 802.11 standards such as 802.11b and/or 802.11g; however, other communications protocols may also be used for the WLAN 320. The WLAN 320 includes one or more wireless RF Access Points (AP) 321 (one of which is shown), that collectively provide a WLAN coverage area. The WLAN 320 may be operated by an enterprise (for example, a business or university) and the access points 321 are connected to an access point (AP) interface 322. The AP interface 322 provides translation and routing services between the access points 321 and the network provider system 340 to facilitate communication between the mobile electronic device 100 and other devices (not shown) connected directly or indirectly, to the network provider system 340. The AP interface 322 is implemented using a computer, for example, a server running a suitable computer program or software.

According to one embodiment, other interfaces may be implemented using a physical interface 330. The physical interface 330 may include an Ethernet, Universal Serial Bus (USB), Firewire and/or infrared (IR) connection implemented to exchange information between the network provider system 340 and the communications device 100 when physically connected therewith.

The network provider system 340 comprises a server which is located behind a firewall (not shown). The network provider system 340 provides access for the communications device 100, through either the WAN 310, the WLAN 320, or one of the physical interfaces 330 to the devices connected, for example, through an enterprise network 350 (e.g. an intranet), to the network provider system 340, such as a network 350, an email server 355, one or more application/content servers 360, a second WAN 370 and/or an origin server 380.

According to one embodiment, a mobile data delivery module 345 provides HTTP connectivity between the wireless WAN 310 and the WLAN 320 and the other physical connections 330 and devices and/or networks connected directly or indirectly to the network provider system 340. In one embodiment, the mobile data delivery module 345 is implemented on a computer, such as one housing the network provider system 340. The network 350, the email server 355, the application/content server 360, the WAN 370 and the origin server 380 are individually and/or collectively in various combinations, a content source for the network provider system 340. It will be appreciated that the system shown in FIG. 3 comprises one possible communications network or configuration for use with the mobile communication device 100.

The network 350 may comprise a local area network, an intranet, the Internet, a direct connection, or combinations thereof. According to one embodiment, the network 350 comprises an intranet for a corporation or other type of organization.

In one example configuration, the email server 355 is connected to the network 350. This server 355 is configured to direct or redirect email messages received over the WAN 370 and internally within the enterprise network 350 to be addressed to the mobile electronic device 100.

The application/content server 360 may be connected to the network 350 and also to another network, for example, the second WAN 370.

The second WAN 370 may further connect to other networks. In one embodiment, the second WAN 370 comprises or is configured with the Internet, a direct connection, a LAN, a wireless communication link, or any combination thereof.

Content providers, such as the origin server 380, or Web servers, may be connected to the WAN 370.

The Global Positioning System (GPS)

The communications environment 300 may also include a network of geosynchronous Global Positioning System (GPS) satellites 390. The concept of the Global Positioning System was originally proposed as a worldwide means of navigation for the US military. It originally consisted of a series of 24 satellites 390 in orbit at an altitude of about 11,000-12,000 miles above the earth's surface. As of September 2007, there are 31 actively broadcasting satellites in the GPS constellation. The additional satellites improve the precision of the GPS receiver calculations by providing redundant measurements.

This high orbit, which lies well above the earth's atmosphere, yields a very precise and stable orbit that may be very accurately measured by a ground station. The orbit of each satellite is monitored twice daily by each of five monitoring stations.

The position of each satellite 390 is known at any given time, including minor adjustments for gravitational effects of other planetary bodies, such as the sun and moon. Typically, this information is stored in an almanac within each GPS receiver subsystem 260, subject to periodic adjustments through message signals transmitted by each of the satellites 390.

Each satellite 390 makes a complete orbit every 12 hours. The original constellation was spread out in six orbital planes. Thus, at any given point in time, from any point on earth, at least four or five satellites 390 may lie above the horizon and thus remain in view. With the increased number of satellites, the constellation was changed to a non-uniform arrangement to improve reliability and availability of the system upon a multiple satellite failure, relative to the former uniform system.

Each satellite 390 continuously transmits high-frequency, low power radio signals comprising a coded message on two channels that contain timing information and data about the satellite's orbit. One of the channels, denoted L1, is unencrypted and accessible by the general public. It generally transmits at 1575.42 MHz. The other, denoted L2, is only for use by the U.S. military's special receivers. These signals are received by antenna 261, amplified by amplifier 262 and forwarded to the GPS receiver 266.

In either case, the signal consists of an identical coded pseudo-random timing signal generated using a common reference clock signal and a message signal that identifies the transmitting satellite 390 and from which its position may be precisely determined, in conjunction with the almanac.

Each GPS receiver, such as the one 266 implemented in the mobile device 100 and shown in FIG. 2, makes use of the pseudo-random timing signal from typically at least four different satellites 390. The signals from each of these satellites 390 are fully and precisely synchronized with each other and with a complementary signal generated by the receiver 266.

The delay between the signal generated by the GPS receiver 266 and those received by it from the satellites 390 may be used to derive the exact distance between the corresponding satellite 390 and the receiver 266, by multiplying the delay by the speed of light.

Thus, with each received signal, the position of the GPS receiver subsystem 260 is constrained to lie on the surface of an imaginary sphere having a diameter equal to the distance between the subsystem 260 and the transmitting satellite 390 and centered about the known position of the transmitting satellite 390.

The position of the GPS receiver subsystem 260 may thus be obtained by trilateration. With data from only three satellites 390, a geographic non-elevation two-dimensional fix may be obtained, while a three-dimensional fix including elevation may be obtained with data from a minimum of four satellites 390. The most accurate positional fix will be obtained from satellites 390 widely distributed across the sky and in each case having an angular elevation of in excess of 20 degrees above the horizon.

In addition to a positional fix, accurate time of day and velocity information may be deduced from the signals transmitted by the satellites 390.

Optimal reception is obtained when the GPS receiver subsystem 260 is situated outdoors and with good visibility to most of the sky. Significantly degraded performance may be obtained when the GPS receiver is situated indoors, underwater, in caves or in deep canyons where sky visibility may be severely restricted. Typically, clouds or bad weather do not degrade receiver performance.

Clearly, the performance and accuracy of the GPS system and receiver subsystem 260 is dependent upon the accurate synchronization of the coded timing signals transmitted by each satellite 390 and generated by the receiver subsystem 260. Precision, accuracy and synchronicity of the timing information as between the satellites 390 is maintained through the use of several atomic reference clocks in the satellite 390, which are used to generate and synchronize the reference clock signals used to encode the coded timing signals to a common reference clock frequency. However, this is generally not feasible for the GPS receiver subsystem 260.

Rather, the GPS receiver subsystem 260 makes use of a fixed, free-running clock signal having a frequency that is close to the common reference clock signal frequency, to control its operation and to permit synchronization with the GPS satellites 390.

Once it has received timing signals from 3 or 4 satellites 390, the receiver subsystem 260 is able to calculate any error in its clock frequency or phase by assuming that the distance measurements to each satellite 390 are proportionately inaccurate and reset its clock signal to compensate for and eliminate such error by supplying an appropriate frequency offset.

This clock signal is conventionally generated by the GPS receiver 260 from a rough oscillator signal provided as an input to the GPS receiver 260. Typically, the rough oscillator signal is generated by a dedicated temperature-corrected crystal oscillator (TCXO).

As can be seen from FIG. 4, this has been dispensed with in the present application having regard to the fact that in the communications device 100, there may be a plurality of communications receivers, depending upon its particular configuration, for example, a cellular radio receiver in the WAN communications module 221, a WLAN receiver in the WLAN communications subsystem 222 and perhaps in the short-range communications subsystem 223.

Those having ordinary skill in the relevant art will appreciate that by far the majority of such communications receivers rely on a clock oscillator signal to properly receive and decode incoming message data. As shown in FIG. 4, the clock signal from any of such receivers may be appropriated with a concomitant economy in components, cost and circuit board real estate.

Such economy arises from the replacement of the components for a dedicated TCXO, including a clock oscillator circuit, a crystal and temperature compensation components, as well as tuning and/or biasing components, with an NCO 490, which effectively amounts to a few gates and an adder. The cost of implementing an NCO is further reduced when it is recognized that conventional GPS receivers 266 typically already have an NCO for each channel and an additional NCO to strip the carrier from the signal being received from the GPS satellites. As a result, the addition of a further NCO 490 will not add materially to the chip size of the GPS receiver 266. It has been estimated that the cost savings on a component only basis may approach $2.00 per device 100, most of which is attributable to the cost of the crystal. Those having ordinary skill in this art will appreciate that the cost of a $3^{rd}$ party GPS receiver 266 may approach the component cost of the crystal.

In addition to component cost considerations, the replacement of a clock oscillator circuit with an NCO 490 has other salutary benefits. Power consumption will be significantly reduced, always an important consideration for portable and/or handheld devices, with the elimination of a further oscillator circuit that may draw between 1.0 and 1.5 mA at 3 V Vcc on a continuous basis.

Additionally, startup latency may be reduced because the NCO 490 will generate a clock signal immediately (assuming that the VCTCXO 400 is already in operation).

Moreover, with the elimination of a further oscillator circuit, the problem of routing a further set of clock signals about the circuit board to minimize interference will be obviated. By locating the NCO 490 within the GPS receiver 266, there is only one clock signal on the circuit board.

However, simply replacing the dedicated TCXO with an NCO circuit is complicated because of the significant likelihood of discontinuities in the clock signal as a result of synchronizing "kicks", such as from the AFC module 466 as discussed above. While such kicks are appropriate to force synchronization of the WAN communications subsystem 221 with the base station 311, were the frequency of the GPS clock signal 491 being used by the GPS receiver to decode GPS messages from the GPS satellites 390 to be correspondingly adjusted, signal lock may be lost, forcing the GPS receiver 266 back into a lengthy acquisition mode (on the order of several minutes), which is undesirable.

However, the "kicks" to be issued by the AFC module 466 are determinate and known. Accordingly, it is possible to compensate for the discontinuity occasioned by such kicks to the voltage control input of the VCTCXO 400 by providing a commensurate but opposite adjustment to NCO 490 along signal line 468 to maintain a relatively constant frequency and phase continuous clock signal that may be used by the GPS receiver 266 to receive messages from a GPS satellite 390.

A series of curves, formulae and/or tables may be developed to establish the control word value to be supplied to the NCO 490 in order to counteract a given voltage control adjustment to the VCTCXO 400, using the relationship between the control word sent out as a kick along signal line 467 and the voltage generated by the DAC 469, the relationship between the input control voltage of the VCTCXO 400 and the output frequency generated thereby and the relationship between the control word value to be supplied to the NCO 490 and the resulting output frequency.

The present application can be implemented in digital electronic circuitry, or in computer hardware, firmware, software, or in combination thereof. Apparatus of the application can be implemented in a computer program product tangibly embodied in a machine-readable storage device for execution by a programmable processor; and methods actions can be performed by a programmable processor executing a program of instructions to perform functions of the application by operating on input data and generating output. The application can be implemented advantageously on a programmable system including at least one input device, and at least one output device. Each computer program can be implemented in a high-level procedural or object-oriented programming language, or in assembly or machine language, if desired; and in any case, the language can be a compiled or interpreted language.

Suitable processors include, by way of example, both general and specific microprocessors. Generally, a processor will receive instructions and data from a read-only memory and/or a random access memory. Generally, a computer will include one or more mass storage devices for storing data file; such devices include magnetic disks and cards, such as internal hard disks, and removable disks and cards; magneto-optical disks; and optical disks. Storage devices suitable for tangibly embodying computer program instructions and data include all forms of volatile and non-volatile memory, including by way of example semiconductor memory devices, such as EPROM, EEPROM, and flash memory devices; magnetic disks such as internal hard disks and removable disks; magneto-optical disks; CD-ROM and DVD-ROM disks; and buffer circuits such as latches and/or flip flops. Any of the foregoing can be supplemented by, or incorporated in ASICs (application-specific integrated circuits), FPGAs (field-programmable gate arrays) and/or DSPs (digital signal processors).

Examples of such types of computer are programmable processing systems contained in the microprocessor 210 and the GPS receiver 266 suitable for implementing or performing the apparatus or methods of the application. The system may comprise a processor, a random access memory, a hard drive controller, and/or an input/output controller, coupled by a processor bus.

It will be apparent to those having ordinary skill in this art that various modifications and variations may be made to the embodiments disclosed herein, consistent with the present application, without departing from the spirit and scope of the present application.

While preferred embodiments are disclosed, this is not intended to be limiting. Rather, the general principles set forth herein are considered to be merely illustrative of the scope of the present application and it is to be further understood that numerous changes covering alternatives, modifications and equivalents may be made without straying from the scope of the present application, as defined by the appended claims.

Further, the foregoing description of one or more specific embodiments does not limit the implementation of the invention to any particular computer programming language, operating system, system architecture or device architecture. Moreover, although some embodiments may include mobile devices, not all embodiments are limited to mobile devices; rather, various embodiments may be implemented within a variety of communications devices or terminals, including handheld devices, mobile telephones, personal digital assistants (PDAs), personal computers, audio-visual terminals, televisions and other devices.

Moreover, all dimensions described herein are intended solely to be exemplary for purposes of illustrating certain embodiments and are not intended to limit the scope of the invention to any embodiments that may depart from such dimensions as may be specified.

Certain terms are used throughout to refer to particular components. As one skilled in the art will appreciate, manufacturers may refer to a component by different names. It is not intended to distinguish between components that differ in name but not in function.

The terms "including" and "comprising" are used in an open-ended fashion, and thus should be interpreted to mean "including, but not limited to". The terms "example" and "exemplary" are used simply to identify instances for illustrative purposes and should not be interpreted as limiting the scope of the invention to the stated instances.

Also, the term "couple" in any form is intended to mean either a direct or indirect connection through other devices and connections.

Other embodiments consistent with the present application will become apparent from consideration of the specification and the practice of the application disclosed herein.

Accordingly, the specification and the embodiments disclosed therein are to be considered exemplary only, with a true scope and spirit of the invention being disclosed by the following claims.

What is claimed is:

1. A system for providing a clock signal to a navigation satellite receiver in a device comprising a heterodyning communications receiver, the system comprising:

a voltage controlled oscillator for generating an output clock signal having a frequency suitable to heterodyne signals at the heterodyning communications receiver; and a numerically controlled oscillator (NCO) for generating, from the output clock signal, an adjusted output clock signal having a frequency suitable to heterodyne signals at the navigation satellite receiver, wherein a frequency of the output clock signal is governed by a voltage signal to the voltage controlled oscillator received from the heterodyning communications receiver, the frequency of the adjusted output clock signal being adjustable in a phase and frequency continuous manner so as to compensate for a change in an operating environment of the heterodyning communications receiver.

2. The system according to claim 1, wherein the frequency of the adjusted output clock signal is governed by a control value to the NCO from the heterodyning communications receiver so as to counteract the compensation for the change in the operating environment of the heterodyning communications receiver.

3. The system according to claim 2, wherein the control value is modulus added on successive clock cycles of the output clock signal to a previous phase value to reflect a phase that corresponds to the frequency of the adjusted output clock signal.

4. The system according to claim 2, wherein the control value is supplied by an automatic frequency control (AFC) module within the heterodyning communications receiver.

5. The system according to claim 1, wherein the voltage control input is supplied by an automatic frequency control (AFC) module within the heterodyning communications receiver.

6. The system according to claim 5, wherein the AFC module generates a voltage control word and provides it to a digital to analog converter for conversion into the control value.

7. The system according to claim 1, wherein the heterodyning communications receiver is for communications with a station and wherein the change in the operating environment of the heterodyning communications receiver is a change in station.

8. The system according to claim 1, wherein the NCO comprises:
   a. a control word register;
   b. a phase accumulator module adapted to update a previous value thereof to a current value thereof by modulus adding a value contained in the control word register thereto on successive cycles of the output clock signal so as to reflect a phase that corresponds to the frequency of the adjusted output clock signal;
   c. a phase to amplitude converter to convert each current value to a corresponding amplitude value; and
   d. a digital to analog converter to generate an adjusted analog clock signal from the amplitude values for forwarding to the navigation satellite receiver.

9. The system according to claim 1, wherein the heterodyning communications receiver is a wide area network (WAN) communications receiver.

10. The system according to claim 9, wherein the WAN communications receiver is a cellular receiver.

11. The system according to claim 10, wherein the cellular receiver operates in compliance with a Global System for Mobile Communications (GSM) standard.

12. The system according to claim 1, wherein the heterodyning communications receiver is a wireless local area network (WLAN) communications receiver.

13. The system according to claim 1, wherein the navigation satellite receiver operates in a navigation system selected from a group consisting of Global Positioning System (GPS), Galileo, GLONASS and Beidou Compass.

14. The system according to claim 1, wherein the voltage controlled oscillator is a voltage controlled temperature compensated crystal oscillator (VCTCXO).

15. The system according to claim 1, wherein the NCO is coupled to the navigation satellite receiver through a phase locked loop (PLL).

16. The system according to claim 1, wherein the device is a mobile device.

17. The system according to claim 1, wherein the voltage controlled oscillator forms part of the heterodyning communications receiver.

18. A method for providing a clock signal to a navigation satellite receiver in a device comprising a heterodyning communications receiver and a voltage controlled oscillator, the method comprising:
   a. the voltage controlled oscillator generating an output clock signal having a frequency suitable to heterodyne signals at the heterodyning communications receiver; and based on a voltage signal received from the heterodyning communications receiver; and
   b. a numerically controlled oscillator (NCO) generating, from the output clock signal, an adjusted output clock signal in a phase and frequency continuous manner having a frequency suitable to heterodyne signals at the navigation satellite receiver, so as to compensate for a change in an operating environment of the heterodyning communications receiver.

19. The method according to claim 18, wherein the NCO generates the adjusted output clock signal based on a control value from the heterodyning communications receiver so as to counteract the compensation for the change in the operating environment of the heterodyning communications receiver.

20. A numerically controlled oscillator (NCO) coupled to a navigation satellite receiver in a device comprising a heterodyning communications receiver and a voltage controlled oscillator for generating an output clock signal having a frequency suitable to heterodyne signals at the heterodyning communications receiver, the NCO for generating, from the output clock signal, an adjusted output clock signal having a frequency suitable to heterodyne signals at the navigation satellite receiver, wherein a frequency of the output clock signal is governed by a voltage signal to the voltage controlled oscillator received from the heterodyning communications receiver, the frequency of the adjusted output clock signal being adjustable in a phase and frequency continuous manner so as to compensate for a change in an operating environment of the heterodyning communications receiver.

* * * * *